United States Patent
Ishikawa

(10) Patent No.: US 8,434,042 B2
(45) Date of Patent: Apr. 30, 2013

(54) METHOD AND SOFTWARE FOR DESIGNING SEMICONDUCTOR INTEGRATED CIRCUIT INCLUDING OBSERVATION CIRCUIT FOR DETECTING CIRCUIT FAILURE

(75) Inventor: Ryoji Ishikawa, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/141,986

(22) PCT Filed: Dec. 26, 2008

(86) PCT No.: PCT/JP2008/073828
§ 371 (c)(1),
(2), (4) Date: Jun. 23, 2011

(87) PCT Pub. No.: WO2010/073399
PCT Pub. Date: Jul. 1, 2010

(65) Prior Publication Data
US 2011/0265053 A1    Oct. 27, 2011

(51) Int. Cl.
*G06F 17/50* (2006.01)
(52) U.S. Cl.
USPC .............................. 716/112; 716/111; 716/136
(58) Field of Classification Search .................. 716/111, 716/112, 136
See application file for complete search history.

(56) References Cited

U.S. PATENT DOCUMENTS 6,321,370 B1 * 11/2001 Suzuki et al. ................. 716/122
7,176,718 B1 *  2/2007 Hutton et al. .................. 326/41

FOREIGN PATENT DOCUMENTS

| JP | 10-124564 A | 5/1998 |
| JP | 2000-55986 A | 2/2000 |
| JP | 2003-14818 A | 1/2003 |
| JP | 2005-223171 A | 8/2005 |
| JP | 2005-274500 A | 10/2005 |
| JP | 2006-308302 A | 11/2006 |
| JP | 2007-103662 A | 4/2007 |

* cited by examiner

Primary Examiner — Vuthe Siek
(74) Attorney, Agent, or Firm — Miles & Stockbridge P.C.

(57) ABSTRACT

In order to improve a failure detection rate in a layout automatic design process of a DFT circuit, signal lines of the DFT circuit are aggregated by an AND tree circuit 1 or an OR tree circuit instead of an EXOR tree circuit, and outputs thereof are received by an observation flip-flop 2. When a failure detection process of the DFT circuit is performed by using the EXOR tree circuit in the case where partial circuits outputting respective signal lines are shared or the partial circuits have the same structure, the signals cancel each other and the failures of the original partial circuits cannot be detected in some cases. However, such a trouble can be prevented by using the AND tree circuit 1 or the OR tree circuit instead of the EXOR tree circuit.

6 Claims, 14 Drawing Sheets

$c0 = (1 - 3/4) = 1/4$
$c1 = \underline{3/4}$ $c0 = (1 - 1/4) = \underline{3/4}$
$c1 = 1/4$ EXOR tree : THE NUMBER OF GATES 68

AND tree : THE NUMBER OF GATES 31

TOTAL WIRING LENGTH: LARGE    TOTAL WIRING LENGTH: SMALL

METHOD AND SOFTWARE FOR DESIGNING SEMICONDUCTOR INTEGRATED CIRCUIT INCLUDING OBSERVATION CIRCUIT FOR DETECTING CIRCUIT FAILURE

TECHNICAL FIELD

The present invention relates to a design technology and software of a semiconductor integrated circuit, and more particularly to a technology effectively applied to the layout design process of a DFT (Design For Testability) circuit.

BACKGROUND ART

Japanese Unexamined Patent Application Publication No. 2005-223171 (Patent Document 1) discloses a technology for preventing wiring congestion when scan chain groups are connected to constitute a whole scan chain in a semiconductor integrated circuit in which a plurality of scan chain groups are formed. More specifically, when individual scan chain groups are connected to constitute the whole scan chain, the connection sequence of the scan chain groups is determined in order of closeness in mutual distances of the center of gravity coordinates of all the flip-flop layout coordinates included in the respective scan chain groups. Alternately, the connection sequence of the scan chain groups is determined in order of closeness of the mutual distances of position coordinates of gated cells existent in clock systems of the scan chain groups, or in order of closeness of the mutual distances of target cells arbitrarily designated beforehand, or in order of closeness of the mutual distances of flip-flop sets, in which the mutual distances of the scan chain groups are the shortest.

Japanese Unexamined Patent Application Publication No. 2003-014818 (Patent Document 2) discloses a technology that expands the application range of a scan test by a scan test circuit from the traditional static logic failure detection up to timing failure detection at an actual operating frequency. More specifically, even in the case where arbitrary test patterns can be set on the scan flip-flops and a high failure detection rate can be secured in the static logic failure detection, the same logical values cannot be outputted simultaneously from these flip-flops at the scan test due to the relationship between the preceding stage and the subsequent stage of the flip-flops. Therefore, it is difficult to set a test pattern that detects a path delay failure, and a timing failure detection rate at the actual operation frequency cannot be increased. Hence, in a scan test circuit in which a predetermined logic signal is inputted to one input terminal of the scan chain to sequentially obtain the logic result from the output terminal of the scan chain, a plurality of flip-flops which give input values to the same logic circuit and are connected by the scan chain are arranged so as not to be adjacent to each other on the scan chain.

Japanese Unexamined Patent Application Publication No. 2005-274500 (Patent Document 3) discloses a technology for catching the failure responses even if failures simultaneously occur in a plurality of scan-out signal lines in a configuration where the number of external output pins is reduced to be smaller than the number of scan-out signal lines by interposition of a compressor in order to shorten the wiring length of the scan-out signal lines. That is, the compressor is interposed between the scan-out signal lines and the external output pins, and the compressor is configured to make a response, which is different from a response in the case where all are normal, as a response in the case where a plurality of failure responses are simultaneously input from the scan-out signal lines. More specifically, the compressor is configured of compression gates that are EXOR gates or EXNOR gates corresponding to the number of the external output pins, and all the scan-out signal lines are connected to the compression gates in the state where the patterns of input connections to the compression gates are all mutually different.

Japanese Unexamined Patent Application Publication No. 2000-055986 (Patent Document 4) discloses a technology for preventing a malfunction due to a clock skew and the like and realizing a small layout area by connecting the scan chains to be short. More specifically, scan registers are hierarchically grouped based on the clock tree configuration, and the clock signal propagation time from the clock input terminals to respective clock tree buffers and the clock signal propagation time from the clock input terminals to respective scan registers are obtained, and moreover, the clock skew is obtained for each scan register group and an attribute of the shortest wiring length or the malfunction prevention is set for each scan register group based on the clock skew information. Then, a scan chain for the purpose of malfunction prevention is connected to the scan register group to which the malfunction prevention attribute is set, and a scan chain is connected with the shortest wiring length by using the arrangement information to the scan register group to which the shortest wiring length attribute is set.

Patent Document 1: Japanese Unexamined Patent Application Publication No. 2005-223171
Patent Document 2: Japanese Unexamined Patent Application Publication No. 2003-014818
Patent Document 3: Japanese Unexamined Patent Application Publication No. 2005-274500
Patent Document 4: Japanese Unexamined Patent Application Publication No. 2000-055986

SUMMARY OF THE INVENTION

Problems to be Solved by the Invention

For the detection of a failure of a DFT circuit in a layout design process of the DFT circuit, there is a method in which signal lines of the DFT circuit are aggregated by an EXOR (Exclusive OR) tree circuit and the signals from the EXOR tree circuit are received by observation flip-flop circuits, thereby detecting the failure.

This failure detection method using the EXOR tree circuit is widely used because it can perform a test with a small number of test vectors and the cost can be reduced.

In the actual DFT circuit, there are often the cases where partial circuits that output respective signal lines are shared and the partial circuits have the same structure. When the failure detection process of the DFT circuit is performed under such circumstances by using the EXOR tree circuit, the signals cancel each other and the failure of the original partial circuit cannot be detected in some cases.

FIG. 25 is an explanatory diagram showing an observation example of enable signals. As shown in FIG. 25, when a clock gating cell 101 with an observation terminal is used for the configuration of a clock tree, there exists an observation terminal OBS that outputs a clock enable CEN generated by an enable generating logic circuit 102. When a plurality of clock gating cells 101 like this are arranged, the outputs of the observation terminals OBS of these clock gating cells 101 are aggregated by an EXOR tree 103 and electrically connected to an observation flip-flop 104. As described above, when the EXOR tree 103 aggregates the same signals, the signals cancel each other and the failure detection rate by the observation flip-flop 104 decreases. Consequently, the clock enable CEN that can be aggregated by the EXOR tree 103 is only different signals. For example, in a power compiler that automatically inserts the observation circuit, a determination as to whether the enable signals are the same or different is not made, and therefore, there is a fear that the failure detection rate is increased.

In the case where different signals are inputted to the EXOR tree 103, the failure of the original partial circuit can be detected by the observation flip-flop 104 (see FIG. 26). However, in the case where the same signals are inputted to the EXOR tree 103, the signals cancel each other as described above, and therefore, the failure of the original partial circuit cannot be detected by the observation flip-flop 104 (see FIG. 27). Hence, when the same signals are inputted, another EXOR tree 103 and an observation flip-flop 104 electrically connected to that EXOR tree 103 are provided so that the same signals are not inputted to one EXOR tree 103. By this means, it is possible to prevent the decrease of the failure detection rate. However, the increase in the number of observation flip-flops 104 creates a problem that many resources are required for the observation flip-flops 104 themselves.

An object of the present invention is to provide a technology that can improve a failure detection rate in a layout automatic design process of the DFT circuit.

The above and other objects and novel characteristics of the present invention will be apparent from the description of the present specification and the accompanying drawings.

Means for Solving the Problems

The following is a brief description of an outline of the typical invention disclosed in the present application.

The method for designing a semiconductor integrated circuit according to the present invention is a method for designing a semiconductor integrated circuit including an observation circuit for detecting a circuit failure, comprising the steps of:

(a) performing a logical grouping and forming a plurality of clusters for each signal line close in terms of logical hierarchy;

(b) reading an initial information group necessary for a stochastic grouping;

(c) determining a maximum fan-in number electrically connected to one AND tree or one OR tree and including the maximum fan-in number in the initial information group;

(d) performing the stochastic grouping based on the initial information group and creating grouping information of the signal lines;

(e) performing an automatic arrangement of the signal lines based on the grouping information and forming a layout of the signal lines;

(f) after the step (e), aggregating the signal lines to the AND tree or the OR tree based on the grouping information; and (g) arranging the observation circuit on an end terminal of the AND tree or the OR tree so as to be scan-connected, wherein the initial information group includes a netlist, cluster information, toggle information, timing constraint and constraint information required to form the layout, and wherein the step (d) includes:

(d1) the step of collecting, in a first cluster out of the plurality of clusters, the signal lines in which a first probability that a signal becomes 1 is ½ or higher up to a first fan-in number smaller than the maximum fan-in number in descending order of the first probability, thereby forming one or more candidates for the AND tree; and (d2) the step of collecting, in the first cluster, the signal lines in which a second probability that the signal becomes 0 is ½ or higher up to the first fan-in number in descending order of the second probability, thereby forming one or more candidates for the OR tree.

Also, the software according to the present invention is software for designing a semiconductor integrated circuit including an observation circuit for detecting a circuit failure, and the software designs the semiconductor integrated circuit through a process comprising the steps of:

(a) performing a logical grouping and forming a plurality of clusters for each signal line close in terms of logical hierarchy;

(b) reading an initial information group necessary for a stochastic grouping;

(c) determining a maximum fan-in number electrically connected to one AND tree or one OR tree and including the maximum fan-in number in the initial information group;

(d) performing the stochastic grouping based on the initial information group and creating grouping information of the signal lines;

(e) performing an automatic arrangement of the signal lines based on the grouping information and forming a layout of the signal lines;

(f) after the step (e), aggregating the signal lines to the AND tree or the OR tree based on the grouping information; and (g) arranging the observation circuit on an end terminal of the AND tree or the OR tree so as to be scan-connected, wherein the initial information group includes a netlist, cluster information, toggle information, timing constraint and constraint information required to form the layout, and wherein the step (d) includes:

(d1) the step of collecting, in a first cluster out of the plurality of clusters, the signal lines in which a first probability that a signal becomes 1 is ½ or higher up to a first fan-in number smaller than the maximum fan-in number in descending order of the first probability, thereby forming one or more candidates for the AND tree; and (d2) the step of collecting, in the first cluster, the signal lines in which a second probability that the signal becomes 0 is ½ or higher up to the first fan-in number in descending order of the second probability, thereby forming one or more candidates for the OR tree.

Effects of the Invention

The effects obtained by typical embodiments of the invention disclosed in the present application will be briefly described below.

The failure detection rate in the layout automatic design process of the DFT circuit can be improved.

BRIEF DESCRIPTIONS OF THE DRAWINGS

BEST MODE FOR CARRYING OUT THE INVENTION

Figure 1:
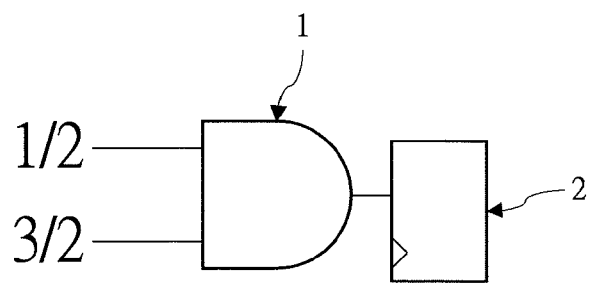
FIG. 1 is an explanatory diagram showing aggregation conditions of signal lines of a DFT circuit by an AND tree circuit in an layout design process of the DFT circuit according to an embodiment of the present invention.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Also, even when mentioning that constituent elements or the like are "made of A" or "made up of A" in the embodiments below, elements other than A are of course not excluded except the case where it is particularly specified that A is the only element thereof.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, components having the same function are denoted by the same reference symbols throughout the drawings for describing the embodiments, and the repetitive description thereof is omitted.

Hereinafter, embodiments of the present invention will be described in detail with reference to the accompanying drawings.

The present embodiment relates to a failure detection process through the observation of an enable signal in a layout automatic design process (for example, EDA (Electronic Design Automation)) of a DFT circuit (observation circuit) using software.

For the detection of a failure of a DFT circuit in a layout design process of the DFT circuit, there is a method in which signal lines of the DFT circuit are aggregated by an EXOR tree circuit and the signals from the EXOR tree circuit are received by observation flip-flop circuits, thereby detecting the failure. However, when the failure detection process of the DFT circuit is performed by using an EXOR tree circuit in the actual DFT circuit, the signals cancel each other and the failure of an original partial circuit cannot be detected in some cases.

Hence, in the present embodiment, the signal lines of the DFT circuit previously aggregated by the EXOR tree circuit are aggregated by an AND tree circuit or an OR tree circuit instead of the EXOR tree circuit, thereby preventing the decrease of the failure detection rate. A method of configuring the AND tree circuit or the OR tree circuit in the present embodiment will be described below.

Figure 2:
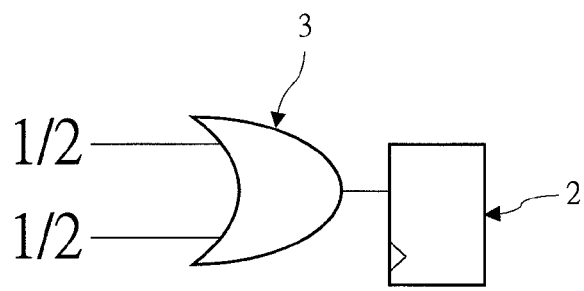
FIG. 2 is an explanatory diagram showing aggregation conditions of signal lines of a DFT circuit by an OR tree circuit in an layout design process of the DFT circuit according to an embodiment of the present invention.

First, assuming that an occurrence probability of "1" in the initial input of the tree circuit is ½, an occurrence probability $c_0$ of "0" in the respective stages of the tree circuit and an occurrence probability $c_1$ of "1" in the respective stages of the tree circuit are calculated. From the calculation results, the occurrence probability $c_0$ of "0" in the final stage and the occurrence probability $c_1$ of "1" in the final stage are compared. When the occurrence probability $c_1$ of "1" in the final stage is higher, an AND tree circuit 1 is configured, and the output from the AND tree circuit 1 is received by an observation flip-flop 2 (see FIG. 1). When the occurrence probability c0 of "0" in the final stage is higher, an OR tree circuit 3 is configured, and the output from the OR tree circuit 3 is received by the observation flip-flop 2 (see FIG. 2).

Figure 3:
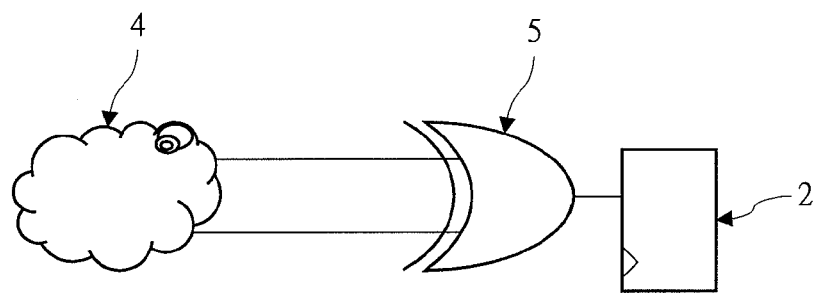
FIG. 3 is an explanatory drawing showing a problem when the signal lines of the DFT circuit are aggregated by an EXOR tree circuit.

When the AND tree circuit 1 or the OR tree circuit 3 as described above is used, the failure detection rate can be improved as compared with the case where the EXOR tree circuit is used. As shown in FIG. 3, when the signals are aggregated by an EXOR tree circuit 5 regardless of the types of an enable logic generating circuit 4, the signals are masked with the EXOR tree circuit 5, and the failure detection by the observation flip-flop 2 cannot be performed. For example, when one enable signal (failure) is simply aggregated with even numbers to all the observation flip-flops 2, the failure detection rate of the enable logic generating circuit 4 becomes zero. On the other hand, when the AND tree circuit 1 or the OR tree circuit 3 is used, the failure is not masked and the failure detection rate can be 100%.

Furthermore, when the AND tree circuit 1 or the OR tree circuit 3 is used, the number of gates that configure the tree circuit can be significantly reduced as compared with the case of using the EXOR tree circuit 5, and a chip size can be reduced. This will be described with reference to FIGS. 4 to 6.

Figure 4:
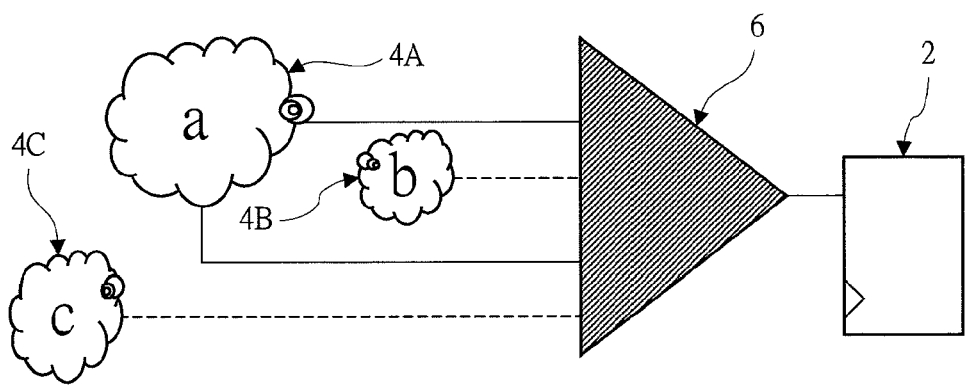
FIG. 4 is an explanatory drawing showing a tree circuit configuration.
Figure 5:
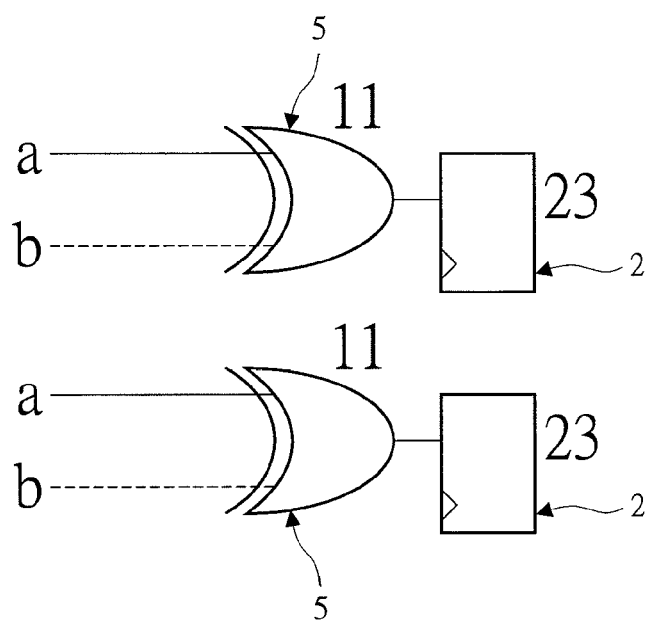
FIG. 5 is an explanatory drawing when the tree circuit shown in FIG. 4 is configured by the EXOR tree circuit.

In the following description, the case where the signals from three enable logic circuits 4A, 4B and 4C are aggregated by a tree circuit 6 as shown in FIG. 4 is taken as an example. As shown in FIG. 5, the signals have to be aggregated by using the EXOR tree circuits 5 appropriately so that the original logics become different when tracing the enable logics, and the observation flip-flop 2 also has to be added as needed. Consequently, assuming that the tree circuit 6 shown in FIG. 4 is formed of the EXOR tree circuit 5, two EXOR tree circuits 5 are required, and the observation flip-flop 2 is also connected to each of the two EXOR tree circuits 5. In one EXOR tree circuit 5 and one observation flip-flop 2, the number of gates is 11 and 23, respectively, and thus the total number of gates in the entire circuit structure shown in FIG. 5 is 68. Note that the numerals affixed to the EXOR tree circuits 5 and the observation flip-flops 2 indicate the number of gates thereof, respectively. The tree structure using the EXOR tree circuit 5 becomes more complicated as the enable logic increases, and the observation flip-flop 2 to be added also increases in proportion to it.

Figure 6:
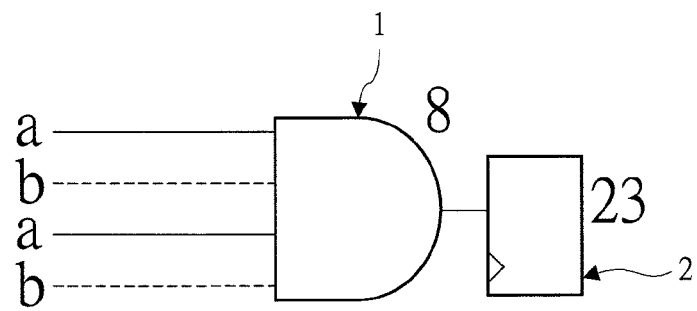
FIG. 6 is an explanatory drawing when the tree circuit shown in FIG. 4 is configured by the AND tree circuit.
Figure 7:
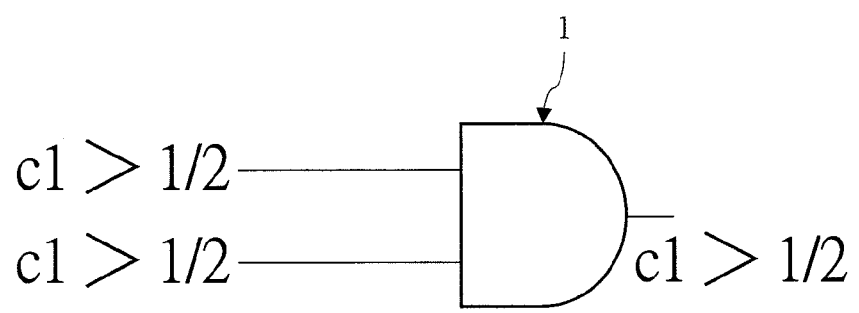
FIG. 7 is an explanatory drawing showing conditions for aggregating the signal lines of the DFT circuit to the AND tree circuit according to an embodiment of the present invention.
Figure 8:
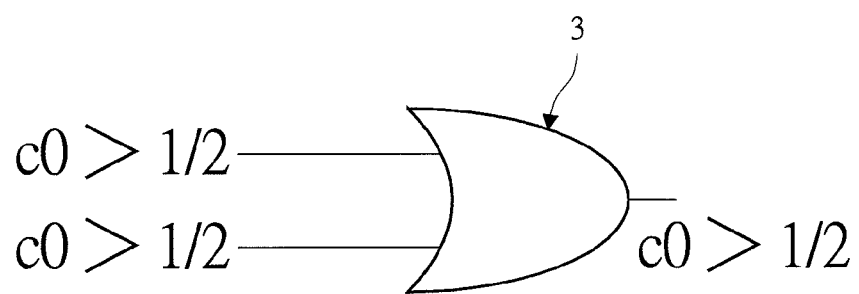
FIG. 8 is an explanatory drawing showing conditions for aggregating the signal lines of the DFT circuit to the OR tree circuit according to an embodiment of the present invention.

On the other hand, assuming that the tree circuit 6 shown in FIG. 4 is formed of the AND tree circuit 1 as shown in FIG. 6, the signals from three enable logic circuits 4A, 4B, and 4C can be aggregated by one AND tree circuit 1, and just one observation flip-flop 2 will suffice. As for the number of gates, since one AND tree circuit 1 and one observation flip-flop 2 are provided with 8 and 23 gates, respectively, the total number of gates for the entire circuit structure shown in FIG. 6 is 31. Note that the numeral affixed to the AND tree circuit 1 indicates the number of gates of the AND tree circuit 1. More specifically, when the tree circuit 6 is formed of the AND tree circuit 1, the number of gates can be significantly reduced as compared with the case where the tree circuit 6 is formed of the EXOR tree circuit 5. As a result, the number of wirings within the chip can be reduced, and this makes it possible to miniaturize the chip.

Here, configuration conditions of the AND tree circuit 1 or the OR tree circuit 3 in the present embodiment will be described with reference to FIGS. 7 to 14.

In general, when a tree structure is constructed by the AND circuit or the OR circuit, the test length sometimes becomes longer than the case where the tree structure is constructed by the EXOR circuit. This can be dealt with by replacing the combination of enable signals. More specifically, in consideration of the occurrence probability c0 of "0" in the respective stages of the tree structure and the occurrence probability c1 of "1" in the respective stages of the tree circuit, the signals in which the probability c1 is higher than ½ are aggregated to the AND tree circuit 1 (see FIG. 7), and the signals in which the probability c0 is higher than ½ are aggregated to the OR tree circuit 3 (see FIG. 8), and by this means, the tree structure can be easily configured.

Figure 9:
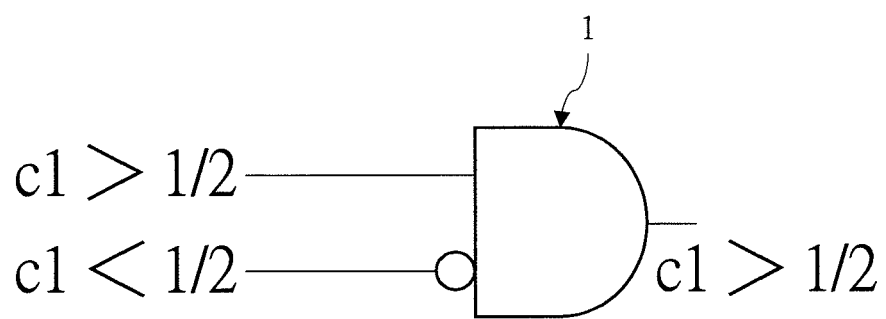
FIG. 9 is an explanatory drawing showing conditions for aggregating the signal lines of the DFT circuit to the AND tree circuit according to an embodiment of the present invention.
Figure 10:
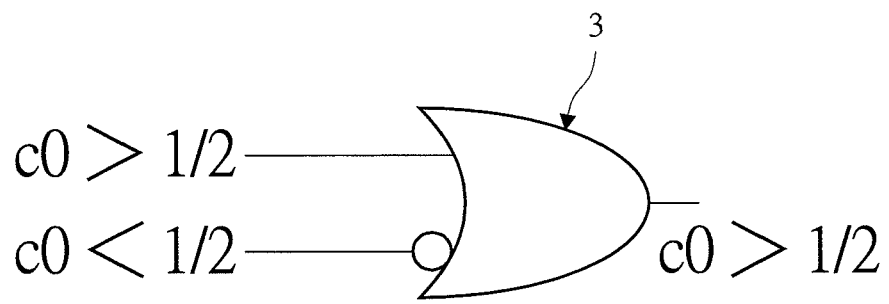
FIG. 10 is an explanatory drawing showing conditions for aggregating the signal lines of the DFT circuit to the OR tree circuit according to an embodiment of the present invention.

When the signals in which the probability c1 is higher than ½ and the signals in which the probability c1 is lower than ½ need to be aggregated to the AND tree circuit 1, the signals may be aggregated to the AND tree circuit 1 by attaching an inverter to the signal in which the probability c1 is lower than ½ (see FIG. 9). Also, when the signals in which the probability c0 is higher than ½ and the signals in which the probability c0 is lower than ½ need to be aggregated to the OR tree circuit 3, the signals may be aggregated to the OR tree circuit 3 by attaching an inverter to the signal in which the probability c0 is lower than ½ (see FIG. 10).

Figure 11:
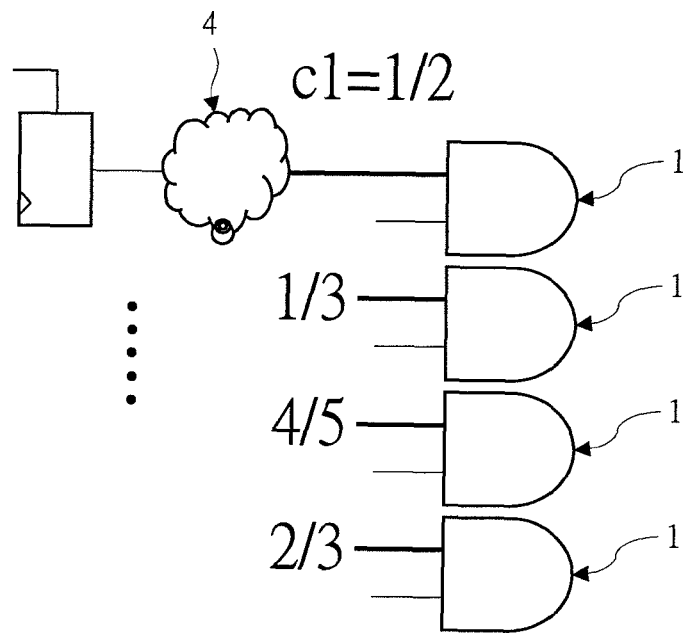
FIG. 11 is an explanatory drawing showing an example in which the probabilities of the signals outputted from an enable logic generating circuit in the DFT circuit are calculated to collect the signal lines configuring the tree structure according to an embodiment of the present invention.
Figure 12:
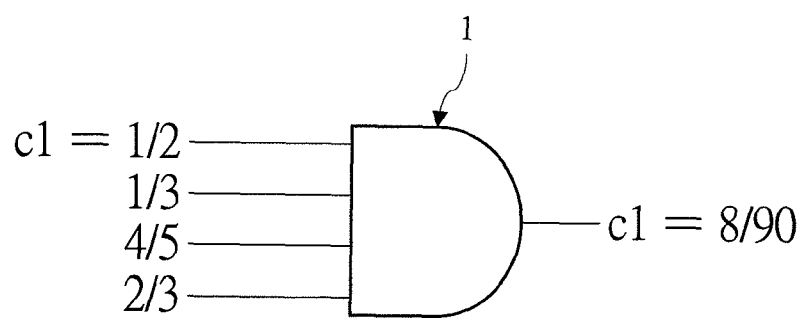
FIG. 12 is an explanatory drawing showing an example in which the signal lines collected in FIG. 11 are aggregated to configure an AND tree circuit.
Figure 13:
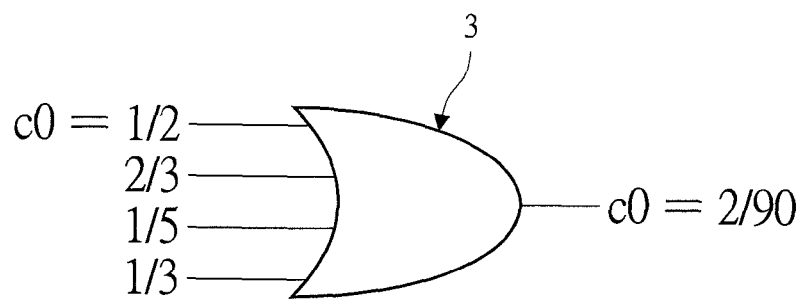
FIG. 13 is an explanatory drawing showing an example in which the signal lines collected in FIG. 11 are aggregated to configure an OR tree circuit.

Next, the configuration example of a 4-input tree structure will be described. First, the probabilities of the signals outputted from respective enable logic generating circuits 4 are calculated, and the signal lines configuring the tree structure are collected. FIG. 11 illustrates the case where the signals to be aggregated to the AND tree circuit 1 are collected.

Subsequently, after respective collected signal lines are aggregated and the AND tree circuit 1 (see FIG. 12) or the OR tree circuit 3 (see FIG. 13) is configured, cost calculation is performed. Aggregation conditions at this time are such that, as described above with reference to FIGS. 7 to 10, the signal lines in which the probability c1 is higher than ½ are aggregated to the AND tree circuit 1, the signal lines in which the probability c0 is higher than ½ are aggregated to the OR tree circuit 3, and when the signal lines in which the probabilities c1 and c0 are lower than ½ have to be also aggregated to the AND tree circuit 1 or the OR tree circuit 3, they are aggregated by attaching an inverter.

Figure 14:
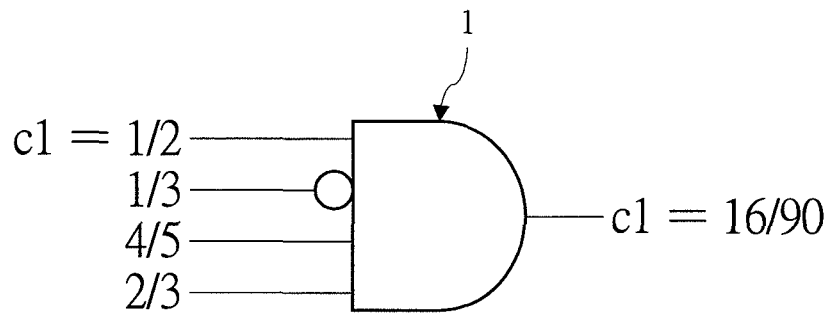
FIG. 14 is an explanatory drawing showing a case where an inverter is inserted to one signal line and then respective signal lines are aggregated by an AND tree circuit 1.

Subsequently, the signals whose probabilities c1 and c0 are the highest are selected from the respective tree circuits (AND tree circuit 1 and OR tree circuit 3). By this means, a pattern length of the tree structure can be decreased, and thus the production cost can be reduced. At this time, when the probabilities (failure detection rate) c1 and c0 can be made highest in the tree circuit by inserting an inverter to the signal line, the tree circuit is selected after the inverter is inserted to the signal (see FIG. 14). Note that FIG. 14 illustrates the case where respective signal lines are aggregated by the AND tree circuit 1 after an inverter is inserted to one signal line.

Figure 15:
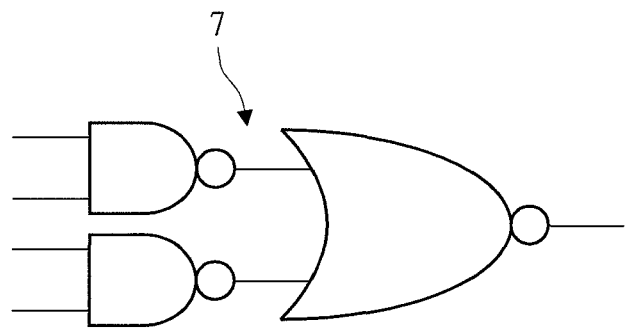
FIG. 15 is an explanatory drawing showing a NAND-NOR circuit, which is an equivalent circuit of the AND tree circuit.
Figure 16:
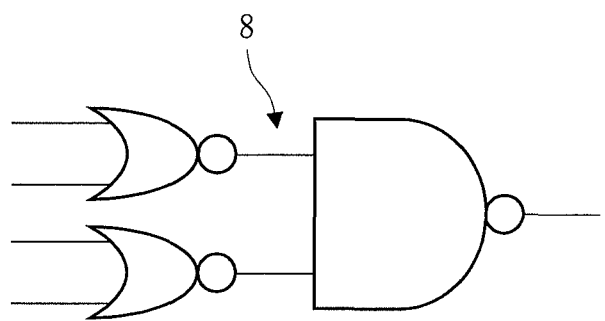
FIG. 16 is an explanatory drawing showing a NOR-NAND circuit, which is an equivalent circuit of the OR tree circuit.

While the structures of the AND tree circuit 1 and the OR tree circuit 3 have been described above with reference to FIGS. 7 to 10, the actual circuit may be configured as a NAND-NOR circuit 7 (see FIG. 15) and a NOR-NAND circuit 8 (see FIG. 16), which are equivalent circuits of the AND tree circuit 1 and the OR tree circuit 3, respectively.

Next, probability calculation in the enable logic generating circuit 4 will be described.

First, the following (1) to (3) can be shown as examples of the method of providing initial values of the occurrence probability c0 of "0" and the occurrence probability c1 of "1" when probability calculation of respective enable logics is performed.

(1) The probabilities c0 and c1 in the respective inputs of the initial stage of the tree structure and the output of the flip-flop are set to ½ and propagated.

(2) Toggle information is inputted to respective gate inputs of the tree structure. The toggle information may be given only to a part of the inputs of the tree structure and be propagated to other parts.

(3) The initial values are given to respective gate inputs of the tree structure at random (by random number). It may be given only to a part of the inputs of the tree structure at random (by random number) and be propagated to other parts.

As described above, the enable signals to which the initial values of the probabilities c0 and c1 are given are aggregated by the AND tree circuit 1 or the OR tree circuit 3. Since the signals are aggregated by the AND tree circuit 1 or the OR tree circuit 3, any enable signals can be aggregated. On the other hand, when the enable signals are aggregated by the AND tree circuit 1 or the OR tree circuit 3, attention needs to be paid to the following points (a) and (b).

(a) Physical resources such as the chip area and the number of flip-flops are efficiently used.

(b) The enable signals are aggregated to the tree structure so that the test length is shortened for making the stochastic failure detection easy.

Figure 17:
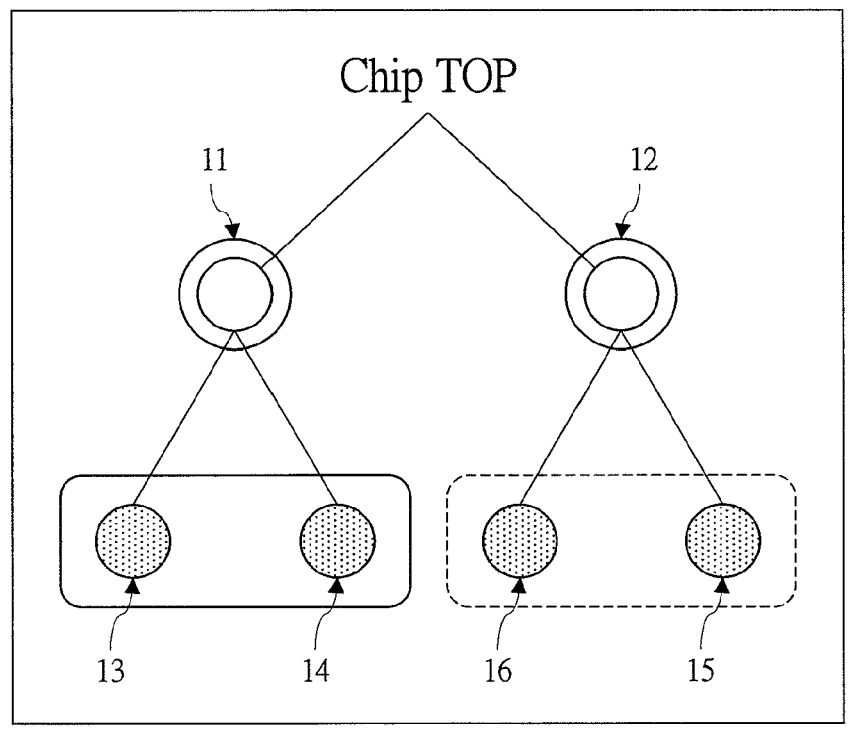
FIG. 17 is an explanatory drawing showing a logic tree structure of a chip having a CPU and a graphics operation unit.
Figure 18:
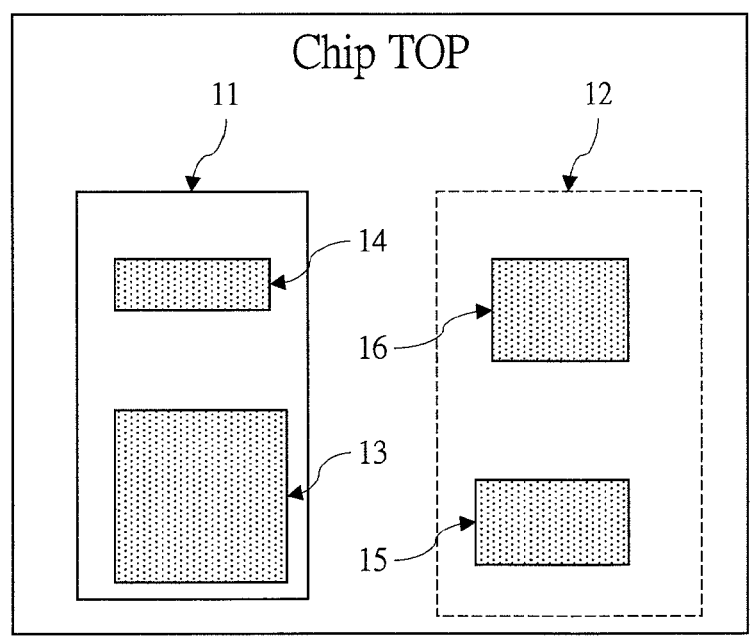
FIG. 18 is an explanatory drawing showing a circuit cell layout of the chip having the CPU and the graphics operation unit.

Here, the point (a) "efficient use of physical resources" described above will be described with reference to FIGS. 17 and 18. FIGS. 17 and 18 show the logic tree structure and the circuit cell layout of a chip having a CPU (Central Processing Unit) 11 and a graphics operation unit 12, respectively.

If the circuit cell layout is not yet created, the grouping of the observation signals is first performed at positions close in terms of logical hierarchy, and the arrangement of the circuit cells is also performed in consideration of logical hierarchy closeness. More specifically, logically, a core circuit 13 and a cache memory circuit 14 are combined by the CPU 11, and a VPU (Visual Processing Unit) 15 and a multiplier 16 are combined by the graphics operation unit 12. Furthermore, the CPU 11 and the graphics operation unit 12 are combined logically by one chip.

If the circuit cell layout is being created, the observation signal lines are selected so as to make a distribution area small based on the circuit cell arrangement information for creating the circuit cell layout, and the number of observation signal lines and a fan-out number are designated.

Next, the point (b) "the enable signals are aggregated to the tree structure so that the test length is shortened for making the stochastic failure detection easy" described above will be described.

If the circuit cell layout is not yet created, the observation signal lines are first grouped so as to make the probability of detecting the failure highest. More specifically, the grouping and the tree configuration go through, for example, the following procedures (b1) to (b3).

(b1) Threshold value (maximum value of the fan-in number aggregated to one tree) of the observation signal lines aggregated to one observation flip-flop 2 is determined.

(b2) The observation signal lines adjacent to each other are aggregated by the fan-in number within the threshold value of the observation signal lines to be aggregated to one observation flip-flop 2 determined by the (b1) above. At this time, as described above, when the observation signal lines in which the occurrence probability c1 of "1" is ½ or higher are aggregated, it becomes a candidate for the AND tree circuit 1, and when the observation signal lines in which the occurrence probability c0 of "0" is ½ or higher are aggregated, it becomes a candidate for the OR tree circuit 3.

(b3) When the observation signal lines in which the occurrence probability c1 of "1" is lower than ½ are present in the observation signal lines that are aggregated to the candidate for the AND tree circuit 1, the observation signal lines are connected to the AND tree circuit 1 via the inverter. Also, when the observation signal lines in which the occurrence probability c0 of "0" is lower than ½ are present in the observation signal lines that are aggregated to the candidate for the OR tree circuit 3, the observation signal lines are connected to the OR tree circuit 3 via the inverter.

After the grouping of the observation signal lines and the tree configuration through the procedures (b1) to (b3) above, the circuit cell layout is created. After creating the circuit cell layout, the re-grouping of the observation signal lines and the reconfiguration of the tree are performed exclusively to the circuit cells arranged adjacently to each other through the procedures (b1) to (b3) above. In the case where no consideration is given to the procedures (b1) to (b3) before creating the circuit cell layout, the circuit cells arranged adjacently are mutually clustered based on the arrangement state of respective circuit cells after creating the circuit cell layout, and the grouping of the observation signal lines is performed so as to increase the occurrence possibility c1 of "1" or the occurrence possibility c0 of "0", and the observation signal lines are aggregated to the AND tree circuit 1 or the OR tree circuit 3.

Figure 19:
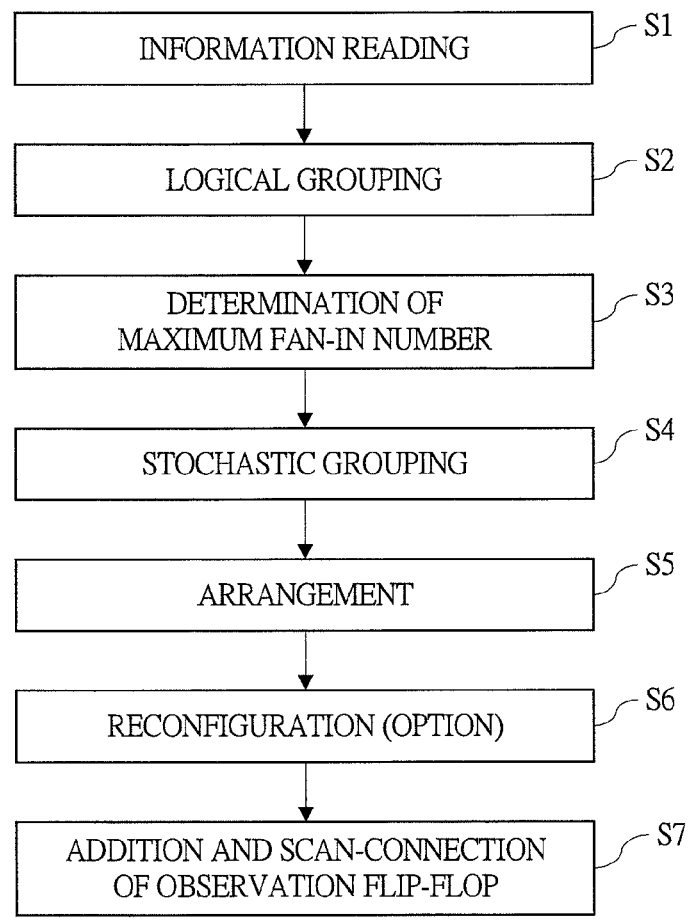
FIG. 19 is a flowchart showing a method of aggregating the signal lines of the DFT circuit to a tree circuit according to an embodiment of the present invention.

Hereinafter, the method of configuring the tree described above will be summed up together with the positioning in the layout design process of the DFT circuit by using the flowchart shown in FIG. 19.

First, an initial information group necessary for a logical grouping and a stochastic grouping is read (Step S1). In the present embodiment, the initial information group includes, for example, a netlist, cluster information, toggle information, timing constraint, constraint information to form the circuit cell layout and the like. The netlist indicates the information (or file) that describes the functions of the chip by the primitive logic elements (AND, OR and others) and the connection of signal nets. Clustering is made for each function based on the information described in the netlist, and this is collected as a mass of logics (functions), and the structure obtained in consideration of the connection thereof becomes the logic tree structure. Therefore, the logic tree structure is higher in level of abstraction than the netlist.

Figure 20:
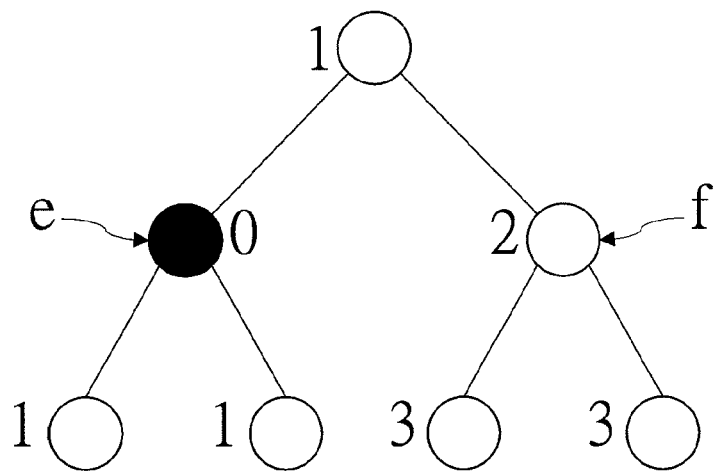
FIG. 20 is an explanatory drawing showing a logical grouping of the signal lines.

Subsequently, the logical grouping is performed to form a plurality of clusters for each observation signal line close in terms of logical hierarchy (Step S2). Here, a logic tree structure is prepared and a clustering is performed for each signal line close in terms of logical hierarchy, thereby forming a plurality of clusters. This will be described further in detail by using the logic tree structure shown in FIG. 20. First, an enable signal e is arbitrarily selected, and a logical connection level of the enable signal located in the same hierarchy as that of the enable signal e is set to zero. The connection level of the enable signal in the hierarchy directly connected from that hierarchy is set to 1, and the connection level of the enable signal further moved from there and located in the hierarchy connected to that hierarchy is set to 2. In this manner, the more the enable signal is logically apart in the hierarchy, the larger the value of the connection level becomes. For example, when an enable signal f is located at the position of the connection level of 2, this can be expressed as L [e] [f]=2 (L indicates a logical connection degree between e and f and a distance of the logical hierarchy). Since the enable signals logically in close connection, that is, the enable signals with small connection levels are collected in the logical grouping, a cluster of the enable signals is formed so that $\Sigma L$ [ei] [ej] which is a total sum of L [ei] [ej] is made smallest between arbitrary enable signals ei and ej.

Subsequently, the maximum number of the observation signal lines connected to one observation flip-flop 2, that is, the maximum fan-in number is determined and included in the initial information group described above (Step S3). The maximum fan-in number in this case affects a test cost, and when the maximum fan-in number is large, the test cost becomes high but the number of gates decreases, and when the maximum fan-in number is small, the test cost becomes low but the number of gates increases. More specifically, since the maximum fan-in number is in the trade-off relationship between the integration degree of the circuit and the test cost, the maximum fan-in number is selected depending on which one of the integration degree of the circuit and the test cost is emphasized in accordance with the usage of the chip.

Subsequently, a stochastic grouping is performed based on the initial information group (Step S4). Here, the observation signal lines within the cluster are stochastically divided and grouped so as to have the aggregation (fan-in number (first fan-in number)) equal to or less than the maximum fan-in number in each cluster formed by the logical grouping, thereby creating the grouping information. Generally, the fan-in number at this time takes a numerical value that is a factorial of 2 such as 4, 8, 16 and others. When the fan-in number is small, the failure can be detected with a short test length. On the other hand, however, a large number of circuit resources are required. Since the fan-in number, the test length and the corresponding circuit resources are in a trade-off relationship, the fan-in number is appropriately determined by a user upon consideration of the circuit resources. As described above, in the stochastic grouping in each cluster (first cluster), the observation signal lines are aggregated by the AND tree circuit 1 when the occurrence probability (first probability) $c_1$ of "1" is higher than ½ in the final stage of the tree circuit, and are aggregated by the OR tree circuit 3 when the occurrence probability (second probability) $c_0$ of "0" is higher than ½. When the observation signal lines in the cluster are stochastically grouped, the observation signal lines are collected and grouped in descending order of the occurrence probability $c_1$ of "1" or the occurrence probability $c_0$ of "0".

Subsequently, the AND tree circuit 1 and the OR tree circuit 3 are automatically arranged based on the constraint information for forming the circuit cell layout included in the initial information group described above, and the layout of respective signal lines, that is, the circuit cell layout is formed (Step S5).

Figure 21:
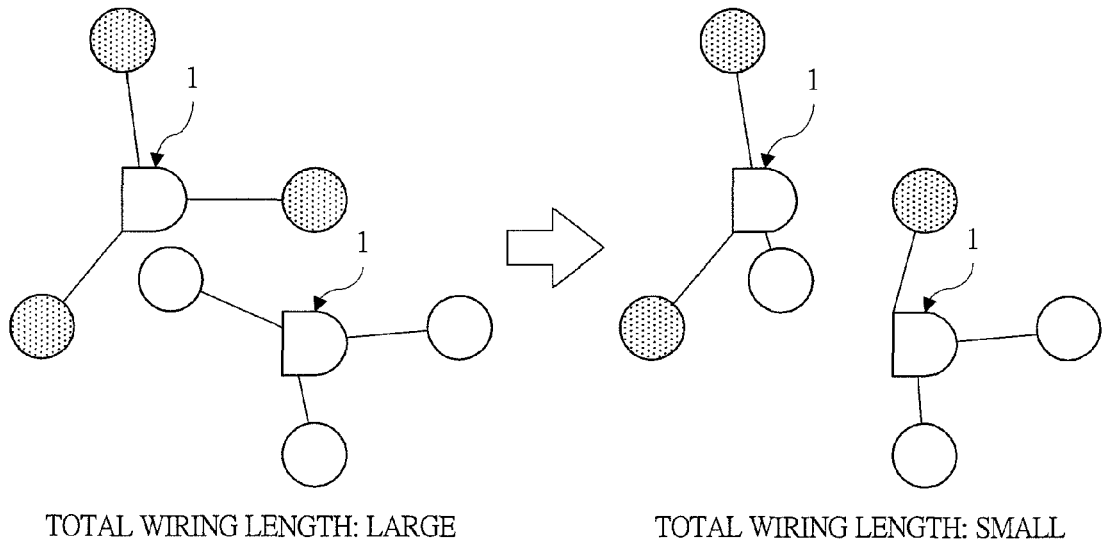
FIG. 21 is an explanatory drawing showing a reconfiguration of the tree structure after forming the circuit cell layout.

After the circuit cell layout is formed, the tree structures of the AND tree circuit 1 and the OR tree circuit 3 constructed in Step S4 may be reconfigured to construct the trees again by the AND tree circuit 1 and the OR tree circuit 3 (Step S6). More specifically, after the circuit cell layout is formed and the respective signal lines are arranged, the optimization of timing operation or the like may be executed. In such a case, physical arrangement positions of the signal lines may also be changed. At this time, the circuit resources can be reduced and transition countermeasures can be taken by the reconfiguration of the aggregated enable signals in some cases. That is, when the total wiring length, which is a sum of wiring length from a certain enable signal to the AND or the OR, is considered and the total wiring length of both the AND tree circuits 1 or the OR tree circuits 3 becomes shorter by the swapping with another AND tree circuit 1 and OR tree circuit 3, the tree structures of the AND tree circuit 1 and the OR tree circuit 3 constructed in Step S4 is reconfigured (see FIG. 21).

Subsequently, the observation flip-flops 2 are arranged on the end terminals of the AND tree circuit 1 and the OR tree circuit 3 and they are scan-connected (Step S7).

Incidentally, there may be a case where the tree structure is configured after the circuit cell layout is first formed as described above. This case is summed up by using the flowchart shown in FIG. 22.

First, the initial information group necessary for stochastic grouping is read (Step S11). The initial information group to be read here includes nearly the same information as that of the initial information group read in Step S1 in FIG. 19.

Subsequently, the circuit cells are arranged based on the constraint information required to form the circuit cell layout included in the initial information group read in Step S11, and the layout of the respective signal lines, that is, the circuit cell layout is formed (Step S12).

Subsequently, the maximum number of the observation signal lines connected to one observation flip-flop 2, that is, the maximum fan-in number is determined, and is included in the initial information group (Step S13).

Subsequently, from the arrangement state of respective circuit cells after the preparation of the circuit cell layout, the circuit cells arranged adjacently to each other are mutually clustered, and the grouping of the observation signal lines is performed so that the occurrence probability $c_1$ of "1" or the occurrence probability $c_0$ of "0" becomes high, and the observation signal lines are aggregated to the AND tree circuit 1 or the OR tree circuit 3 (Step S14). Here, the observation signal lines are stochastically divided and grouped so as to have the aggregation (fan-in number) equal to or smaller than the maximum fan-in number included in the initial information group. Also in this case, in the stochastic grouping, the observation signal lines are aggregated by the AND tree circuit 1 when the occurrence probability $c_1$ of "1" is higher than ½ in the final stage of the tree circuit, and are aggregated by the OR tree circuit 3 when the occurrence probability $c_0$ of "0" is higher than ½. In any cases, the observation signal lines are collected and grouped in descending order of the occurrence probability $c_1$ of "1" or the occurrence probability $c_0$ of "0" in the same manner as described above.

Subsequently, the observation flip-flops 2 are arranged on the end terminals of the AND tree circuit 1 and the OR tree circuit 3, and they are scan-connected (Step S15).

Figure 23:
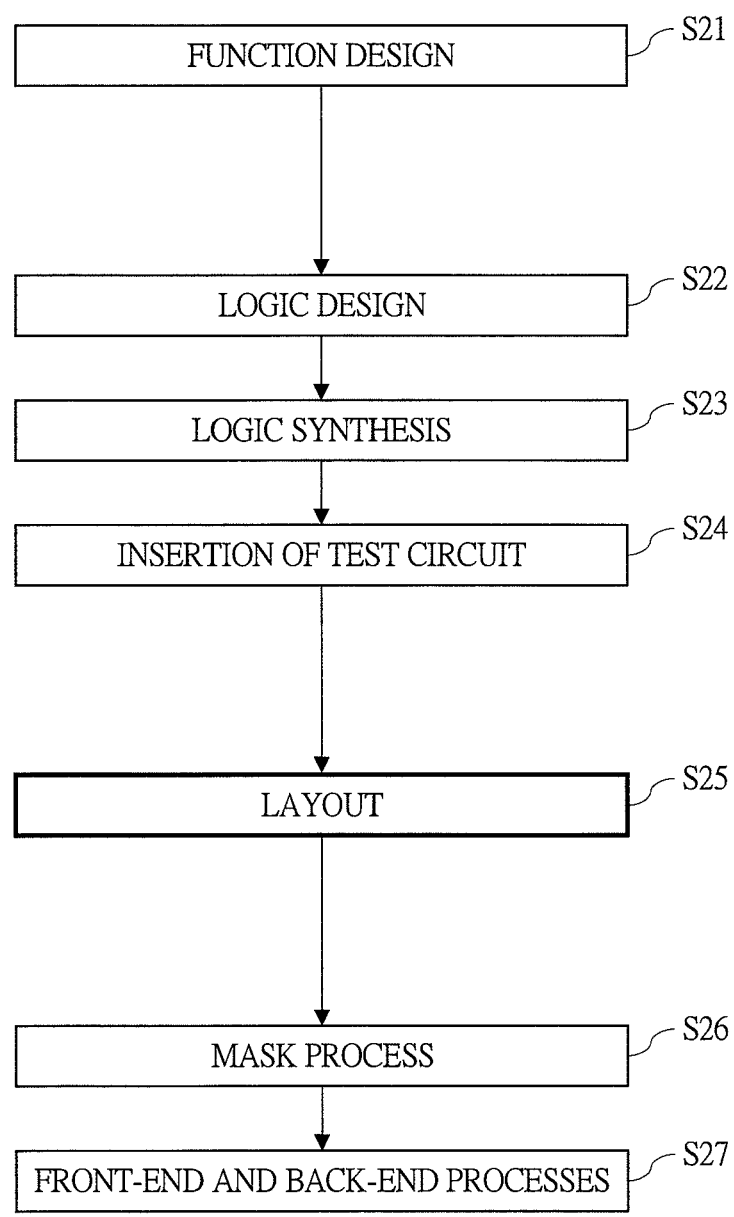
FIG. 23 is a flowchart describing a design process and a fabrication process of a semiconductor integrated circuit according to an embodiment of the present invention.
Figure 24:
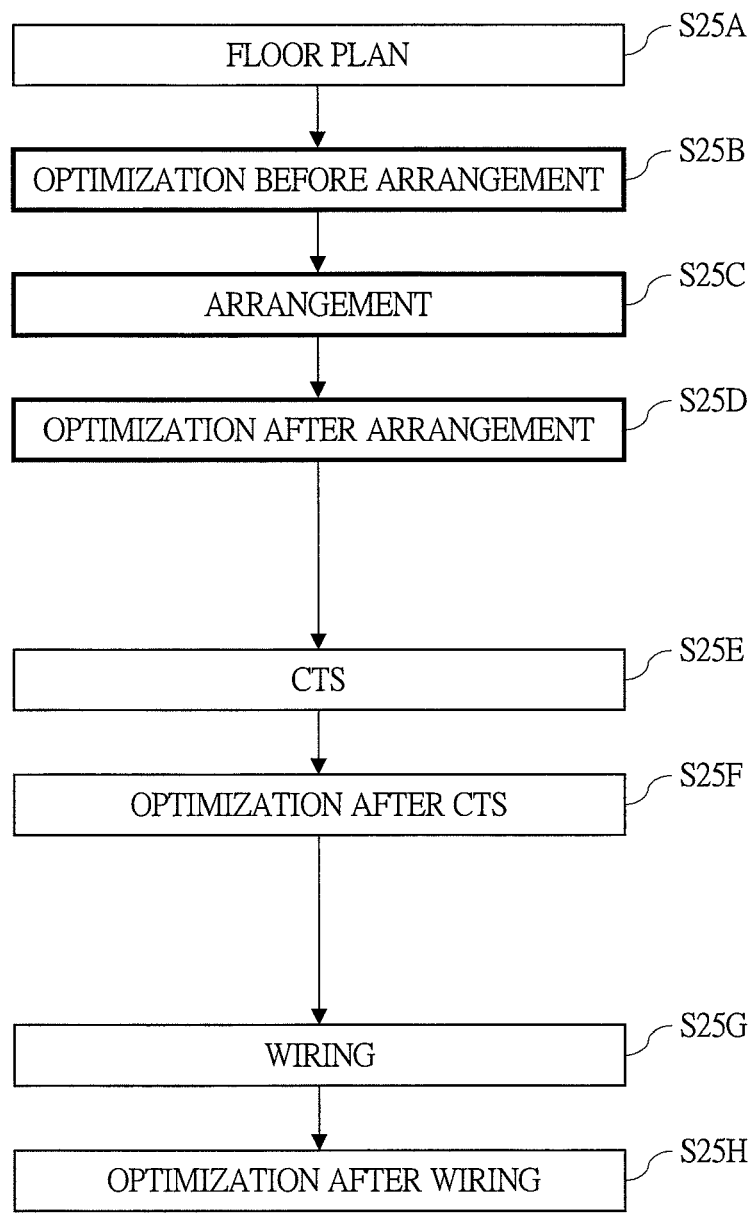
FIG. 24 is a flowchart describing the details of the layout design process of the DFT circuit in the flowchart shown in FIG. 23.
Figure 25:
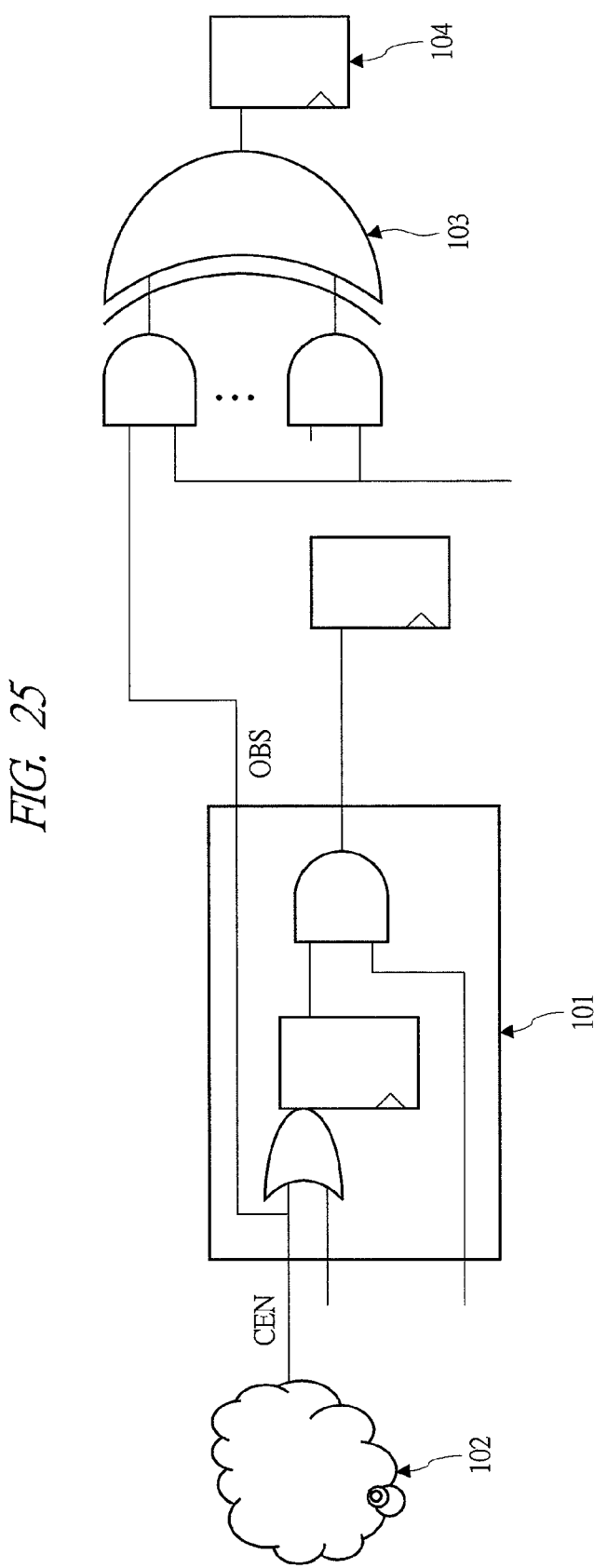
FIG. 25 is an explanatory drawing showing an observation example of an enable signal.
Figure 26:
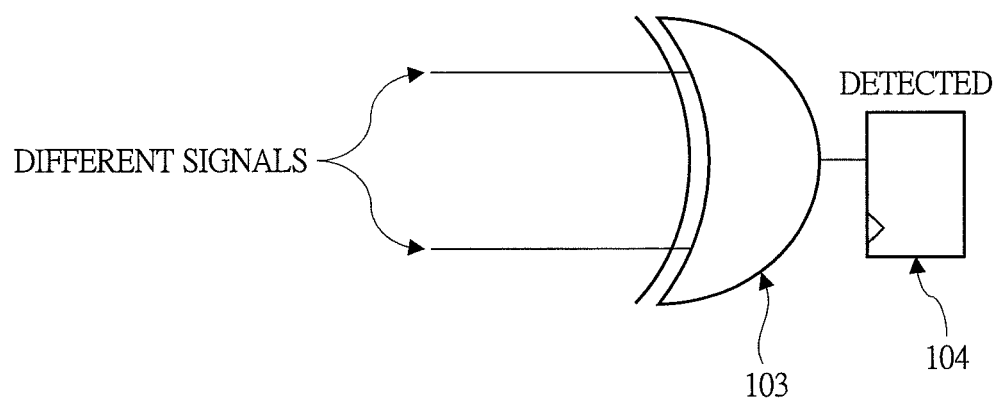
FIG. 26 is an explanatory drawing showing the characteristics of an EXOR tree.
Figure 27:
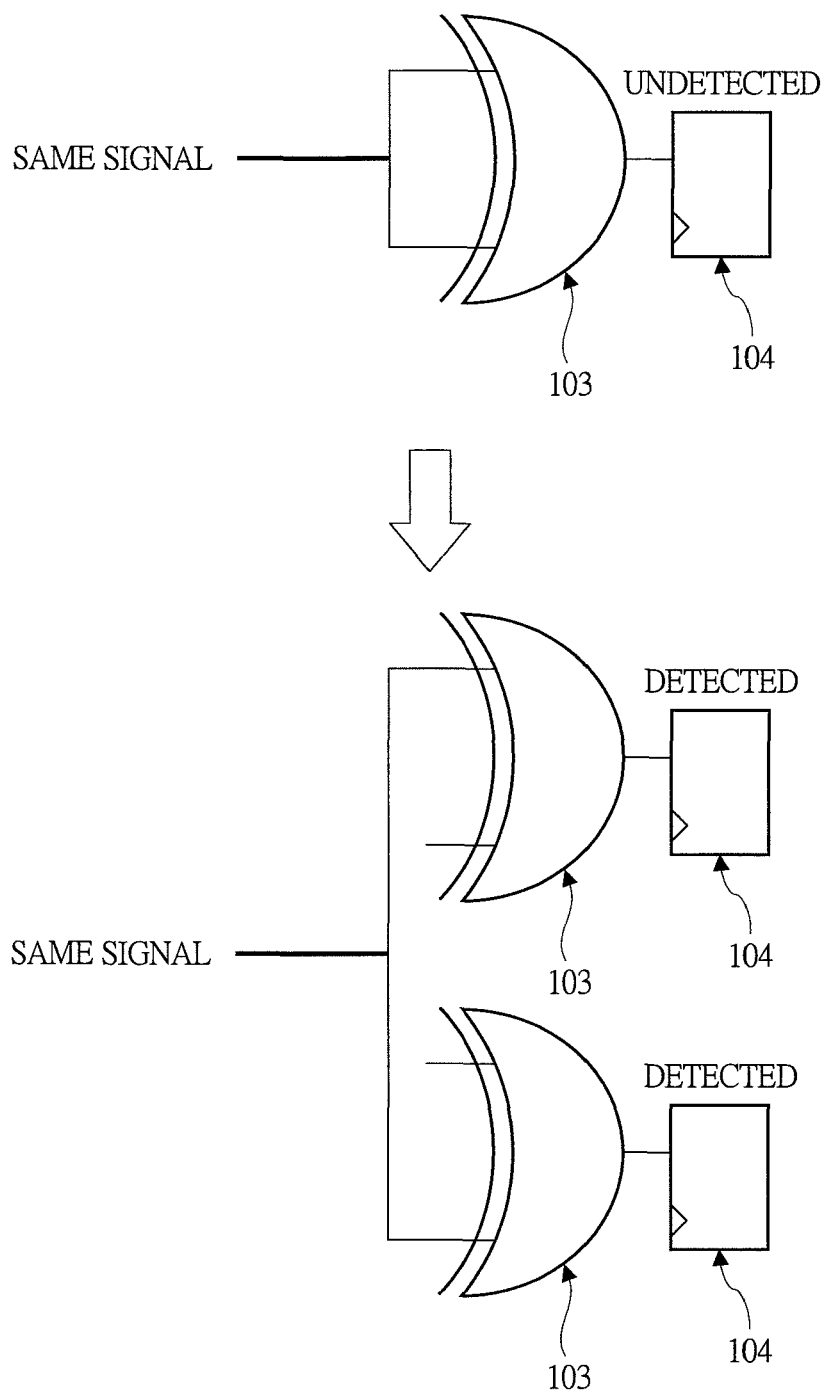
FIG. 27 is an explanatory drawing showing the characteristics of an EXOR tree.

Next, the positioning of the layout design process of the DFT circuit of the present embodiment in the design process and production process of the semiconductor integrated circuit will be described with reference to FIGS. 23 and 24.

First, functions as an entire chip is designed (Step S21).

Figure 22:
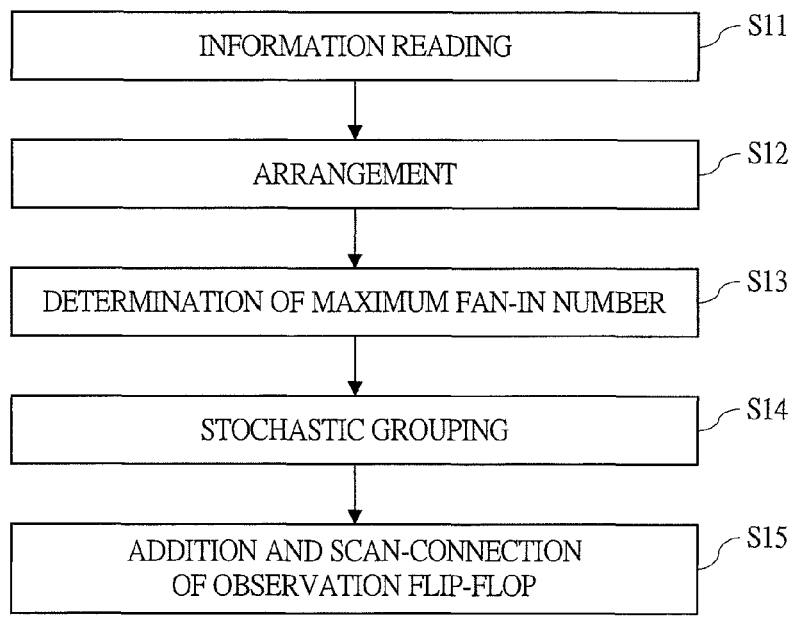
FIG. 22 is a flowchart showing a method of aggregating the signal lines of the DFT circuit to a tree circuit according to an embodiment of the present invention.

Subsequently, a logic design is performed in accordance with the functions of the entire chip designed in Step 21 (Step S22), and is further synthesized into a logic circuit (Step S23). Subsequently, a test circuit is inserted to the logic circuit synthesized in Step S23 (Step S24). Subsequently, the circuit cell layout is created (Step S25). In this step S25, the layout design processes of the DFT circuit summed up in FIGS. 19 and 22 are also included, and the step S25 is further segmentalized into those of the flowchart shown in FIG. 24.

In Step S25, a floor plan design in the chip is first performed (Step S25A). By this floor plan design, the constraint information required to form the circuit cell layout is prepared, and this constraint information can be included in the initial information group described above.

Subsequently, the optimization of the circuit cell is performed before arranging the circuit cells in the chip floor (Step S25B). This optimization of the circuit cells corresponds to Step S2 (logical grouping), Step S3 (determination of the maximum fan-in number) and Step S4 (stochastic grouping) described with reference to FIG. 19.

Subsequently, the optimized circuit cells are arranged in the chip floor (Step S25C). This arrangement step of the circuit cells corresponds to Step S5 described with reference to FIG. 19 and Step S12 described with reference to FIG. 22.

After arranging the circuit cells in the chip floor, the optimization of the circuit cells is performed as needed (Step S25D). This optimization of the circuit cells corresponds to Step S6 (reconfiguration of the tree structure) and Step S7

(arrangement and scan-connection of the observation flip-flops 2) described with reference to FIG. 19, Step S13 (determination of the maximum fan-in number), Step S14 (stochastic grouping) and Step S15 (arrangement and scan-connection of the observation flip-flops 2) described with reference to FIG. 22.

Subsequently, the clock tree synthesis (CTS) is performed (Step S25E). When the clock signal that synchronizes the circuits is distributed to the entire chip, it is necessary to make the signal reach several thousands to several ten thousands of the flip-flops with the same delay value as much as possible. Hence, a tree structure capable of efficiently distributing one clock signal to all the flip-flops is created. The creation of this tree structure is referred to as CTS. After performing this CTS, the optimization of the circuit cells is performed as needed (Step S25F).

Subsequently, the wiring that corresponds to the circuit cell to which the optimization is completed in the chip floor is arranged on the layout (Step S25G). After arranging the wiring, the optimization of the arranged wiring and circuit cell is performed as needed (Step S25H), thereby completing the creation of the circuit cell layout of Step S25.

Next, a mask for transferring a circuit pattern to a semiconductor wafer is fabricated based on the circuit cell layout created in the Step S25 (Step S26). Thereafter, the semiconductor integrated circuit according to the preset embodiment is fabricated through the wafer process using the mask and the packaging process (Step S27).

In the foregoing, the invention made by the inventors of the present invention has been concretely described based on the embodiments. However, it is needless to say that the present invention is not limited to the foregoing embodiments and various modifications and alterations can be made within the scope of the present invention.

INDUSTRIAL APPLICABILITY

The method and software for designing the semiconductor integrated circuit according to the present invention can be applied to the layout automatic design process of a DFT circuit in the fabrication of a chip having a logic circuit such as SoC (System on Chip), microcomputer or the like.

The invention claimed is:

1. A method for designing a semiconductor integrated circuit including an observation circuit for detecting a circuit failure, comprising using a computer to perform the steps of:
   (a) reading an initial information group necessary for a logical grouping and a stochastic grouping;
   (b) performing the logical grouping and forming a plurality of clusters for each signal line close in terms of logical hierarchy;
   (c) determining a maximum fan-in number electrically connected to one AND tree or one OR tree and including the maximum fan-in number in the initial information group;
   (d) performing the stochastic grouping based on the initial information group and creating grouping information of the signal lines;
   (e) performing an automatic arrangement of the signal lines based on the grouping information and forming a layout of the signal lines;
   (f) after the step (e), aggregating the signal lines to the AND tree or the OR tree based on the grouping information; and
   (g) arranging the observation circuit on an end terminal of the AND tree or the OR tree so as to be scan-connected, wherein the initial information group includes a netlist, cluster information, toggle information, timing constraint and constraint information required to form the layout, and
   wherein the step (d) includes:
   (d1) the step of collecting, in a first cluster out of the plurality of clusters, the signal lines in which a first probability that a signal becomes 1 is ½ or higher up to a first fan-in number smaller than the maximum fan-in number in descending order of the first probability, thereby forming one or more candidates for the AND tree; and
   (d2) the step of collecting, in the first cluster, the signal lines in which a second probability that the signal becomes 0 is ½ or higher up to the first fan-in number in descending order of the second probability, thereby forming one or more candidates for the OR tree.

2. The method for designing the semiconductor integrated circuit according to claim 1,
   wherein, when the signal line in which the first probability is lower than ½ is included in the candidate for the AND tree in the step (d1), an inverter is added to the signal line in which the first probability is lower than ½, and
   wherein, when the signal line in which the second probability is lower than ½ is included in the candidate for the OR tree in the step (d2), an inverter is added to the signal line in which the second probability is lower than ½.

3. The method for designing the semiconductor integrated circuit according to claim 1,
   wherein at least one of the AND tree and the OR tree is formed by an equivalent circuit in the step (f),
   wherein the equivalent circuit of the AND tree is a NAND-NOR tree, and
   wherein the equivalent circuit of the OR tree is a NOR-NAND tree.

4. The method for designing the semiconductor integrated circuit according to claim 1,
   wherein, in the step (e), the layout of the signal lines is formed so that the signal lines aggregated to the AND tree or the OR tree in the step (f) come close to each other.

5. The method for designing the semiconductor integrated circuit according to claim 1,
   wherein the first fan-in number is determined so that the signal lines aggregated to the AND tree or the OR tree come close to each other.

6. A method for designing a semiconductor integrated circuit including an observation circuit for detecting a circuit failure, comprising using a computer to perform the steps of:
   (a) reading an initial information group necessary for a stochastic grouping;
   (b) performing an automatic arrangement of signal lines, forming a layout of the signal lines and forming a plurality of clusters from the signal lines;
   (c) determining a maximum fan-in number electrically connected to one AND tree or one OR tree and including the maximum fan-in number in the initial information group;
   (d) performing the stochastic grouping based on the initial information group and creating grouping information of the signal lines;
   (e) aggregating the signal lines to the AND tree or the OR tree based on the grouping information; and
   (f) arranging the observation circuit on an end terminal of the AND tree or the OR tree so as to be scan-connected, wherein the initial information group includes a netlist, cluster information, toggle information, timing constraint and constraint information required to form the layout, and wherein the step (d) includes:

(d1) the step of collecting, in a first cluster out of the plurality of clusters, the signal lines in which a first probability that a signal becomes 1 is ½ or higher up to a first fan-in number smaller than the maximum fan-in number in descending order of the first probability, thereby forming one or more candidates for the AND tree; and (d2) the step of collecting, in the first cluster, the signal lines in which a second probability that the signal becomes 0 is ½ or higher up to the first fan-in number in descending order of the second probability, thereby forming one or more candidates for the OR tree.

* * * * *